United States Patent
You et al.

(10) Patent No.: US 7,445,696 B2
(45) Date of Patent: Nov. 4, 2008

(54) MONITORING ELECTROLYTIC CELL CURRENTS

(75) Inventors: Eugene Yanjun You, Salt Lake City, UT (US); Antonio Berges-Dreyfous, Papua (ID); David B. George, Salt Lake City, UT (US); Daniel Kim, Salt Lake City, UT (US); Keming Zhou, Salt Lake City, UT (US)

(73) Assignee: Kennecott Utah Copper Corporation, Magna, UT (US)

( * ) Notice: Subject to any disclaimer, the term of this patent is extended or adjusted under 35 U.S.C. 154(b) by 169 days.

(21) Appl. No.: 11/082,545

(22) Filed: Mar. 17, 2005

(65) Prior Publication Data
US 2005/0218001 A1    Oct. 6, 2005

Related U.S. Application Data

(60) Provisional application No. 60/553,899, filed on Mar. 17, 2004.

(51) Int. Cl.
*C25C 7/00* (2006.01)

(52) U.S. Cl. ............... 204/228.8; 204/229.8; 204/243.1; 204/247.5; 204/247.1; 205/89; 205/291; 205/374; 205/574

(58) Field of Classification Search ............... 204/243.1, 204/247.1, 247.5, 229.8, 228.8; 205/374, 205/574, 89, 291
See application file for complete search history.

(56) References Cited

U.S. PATENT DOCUMENTS 3,793,166 A    2/1974    Shaw
3,926,750 A    12/1975   Adachi et al.
3,987,351 A    10/1976   Appelberg et al. .......... 318/591
4,035,251 A    7/1977    Shiver et al. .................. 204/67
4,038,162 A    7/1977    Kapanen et al. ......... 204/105 R
4,281,290 A    7/1981    Peacey et al. ................ 324/426
4,351,705 A    9/1982    Ernst et al. ................... 204/108
4,461,989 A    7/1984    Dotson et al. ............... 323/222
4,514,648 A    4/1985    Dotson et al. ............... 307/350

(Continued)

FOREIGN PATENT DOCUMENTS

EP    0597404 A2    5/1994

(Continued)

OTHER PUBLICATIONS

Biswas, et al., Extractive Metallurgy of Copper, 3rd Edition, 1994, pp. 324-357.

(Continued)

*Primary Examiner*—Bruce F Bell
(74) *Attorney, Agent, or Firm*—Whyte Hirschboeck Dudek SC

(57) ABSTRACT

For an electrolytic cell, an apparatus and method are described that use one or more sensors to measure magnetic field strength about a conductor carrying electrical current. A processor is in electrical communication with the sensors and determines a compensated magnetic field strength based on the magnetic fields of other conductors that also carry electrical current to or from the electrolytic cell. The processor uses this compensated magnetic field strength to determine the cathode electrical current carried by the conductor and to identify open and short circuits between the anodes and cathodes of the cell. The described apparatus and method account for interactions between the magnetic fields of the neighboring cathodes.

21 Claims, 11 Drawing Sheets

U.S. PATENT DOCUMENTS

| | | | |
|---|---|---|---|
| 4,786,379 A | 11/1988 | Barnett | 204/67 |
| 5,250,903 A | 10/1993 | Limuti et al. | |
| 5,404,329 A | 4/1995 | Yamagata et al. | 365/189.09 |
| 5,435,897 A | 7/1995 | Zannini | 204/245 |
| 5,526,253 A | 6/1996 | Duley | 363/59 |
| 5,592,115 A | 1/1997 | Kassapian | 327/239 |
| 5,636,115 A | 6/1997 | Drouot | 363/60 |
| 5,687,091 A | 11/1997 | Maung et al. | 364/499 |
| 5,768,115 A | 6/1998 | Pascucci et al. | 363/59 |
| 5,832,411 A | 11/1998 | Schatzmann et al. | 702/23 |
| 5,854,568 A | 12/1998 | Moscaluk | 327/537 |
| 5,880,628 A | 3/1999 | Criscione et al. | 327/589 |
| 5,999,107 A | 12/1999 | Cooper et al. | |
| 6,136,177 A * | 10/2000 | Hung | 205/336 |
| 6,140,820 A | 10/2000 | James | 324/434 |
| 6,231,641 B1 | 5/2001 | Utigard et al. | 75/640 |
| 6,278,318 B1 | 8/2001 | Watanabe | 327/536 |
| 6,281,684 B1 | 8/2001 | James | 324/434 |
| 6,356,137 B1 | 3/2002 | Roohparvar et al. | 327/390 |
| 6,356,741 B1 * | 3/2002 | Bilotti et al. | 455/90.1 |
| 6,503,648 B1 | 1/2003 | Wang | |
| 6,507,237 B2 | 1/2003 | Hsu et al. | 327/538 |
| 6,592,736 B2 | 7/2003 | Fulton et al. | 205/81 |
| 6,833,205 B2 | 12/2004 | Speranza et al. | |
| 2002/0160363 A1 | 10/2002 | McDevitt et al. | |
| 2003/0066759 A1 | 4/2003 | Hardee et al. | 205/565 |
| 2003/0085179 A1 | 5/2003 | Kim et al. | 210/739 |
| 2003/0144581 A1 | 7/2003 | Conn et al. | |
| 2003/0146744 A1 | 8/2003 | Hauenstein et al. | |
| 2004/0211663 A1 * | 10/2004 | Gagne et al. | 204/280 |
| 2005/0023151 A1 | 2/2005 | Sandoval et al. | |
| 2006/0115693 A1 | 6/2006 | Toth et al. | |
| 2006/0213766 A1 | 9/2006 | You | |

FOREIGN PATENT DOCUMENTS

GB 2254416 10/1992

OTHER PUBLICATIONS

Marcy, Henry O. et al, *Wireless Sensor Networks for Area Monitoring and Integrated Vehicle Health Management Applications*, Rockwell Science Center, Thousand Oaks, CA, pp. 1-11, 1999.

Chen, Steven et al., *IEEE 1451 Smart Wireless Machinery Monitoring and Control for Naval Vessels*, presented at the Thirteenth International Ship Control Systems Symposium (SCSS) in Orlando, Florida, Apr. 2003.

Maresca, Patrick, *Linear Circuit Devices for Applications in Battery Powered Wireless Systems*, Microchip Technology, Inc., pp. 1-8, 2003.

Lee, Jr., Lloyd Dewey, *Remote Machinery Condition Monitoring Using Wireless Technology and the Internet*, MAARS Inc., reprinted from http://www.reliabilityweb.com.

Tang, Yonghui et al., *A 0.6V Ultra Low Voltage Operational Amplifier*, Department of Electrical and Computer Engineering Iowa State University, Ames, IA.

Nippon Telegraph and Telephone Corporation and NTT Advanced Technology Corporation, Press Release, *Launch of "Pocket Energy" in May 2004—A Prototype Versatile, Environmentally Friendly Solar-Powered Mobile Power Source for Portable Devices such as Mobile Phones, PDAs, and Digital Cameras—*, Feb. 13, 2004, http://www.ntt.co.jp/news/news04e/0402/040213.html.

Christlo, A., *Computerised Cell Voltage Monitoring at the Electrolytic Refining and Smelting Company of Australia Limited*, Port Kembla, NSW, Australia, Electrorefining and Winning of Copper: Proceedings of the Symposium, pp. 311-331, 1987.

Hoey, D.W., et al., *Modern Tank House Design and Practices at Copper Refineries Pty. Ltd.*, Electrorefining and Winning of Copper: Proceedings of the Symposium, pp. 271-293, 1987.

O'Kane, John et al., *Role of Computerised Cell Voltage Monitoring in Copper Electrolytic Refining at Copper Refineries Pty. Ltd.*, Townsville, Australia, Application of Polarization Measurements in the Control of Metal Deposition, pp. 270-284, 1984.

* cited by examiner

MONITORING ELECTROLYTIC CELL CURRENTS

CROSS-REFERENCES TO RELATED APPLICATIONS

This application claims priority under 35 U.S.C. § 119(e) to Provisional Patent Application Ser. No. 60/553,899, filed on Mar. 17, 2004, the entire disclosure of which is hereby incorporated by reference.

BACKGROUND OF THE INVENTION

1. Field of the Invention

This invention relates to electrolytic cell monitoring for electrometallurgical systems, including, for example, i) electrorefining and electrowinning systems for copper, zinc, nickel, lead, cobalt, and other like metals, ii) electrochemical cells, such as chlor-alkali systems, and iii) molten salt electrolysis, such as aluminum and magnesium electrolysis.

Insofar as the inventive arrangements can be used with electrolytic cell monitoring during a copper refinement stage of producing copper, copper production will be described hereinout for exemplary, representative, and non-limiting purposes.

2. Description of Related Art

Producing copper involves a series of steps involving mining, crushing and grinding, concentrating, smelting, converting, and refining procedures, each of which is well-known, shown in block diagram format in FIG. 1, and elaborated upon below. As depicted, mining 10 loosens and collects ore. Crushing and grinding 12 turn the ore into a crushed and ground ore, comprising a fine powder in which desired ore minerals are liberated. Concentration 14 collects the desired ore minerals into a watery slurry, which is then filtered and dried to produce a liquid concentrate suitable for smelting. Smelting 16 smelts (i.e., melts and oxidizes) iron and sulfur in the liquid concentrate to produce a copper matte. Conversion 18 converts the copper matte by oxidation into a blister copper. And finally, refinement 20 refines the blister copper into a more refined copper.

Referring now to FIG. 1, more specific descriptions will now be provided for further exemplary, representative, and non-limiting purposes:

A. Mining 10

As known, large amounts of ore containing various minerals exist beneath the surface of the Earth, comprising one or more of a copper sulfide or copper-iron-sulfide mineral, such as chalcocite, chalcopyrite, and bornite. Holes are drilled into this ore so that explosives can be detonated to loosen the ore and make it amenable to loading and hauling to a crushing and grinding facility.

B. Crushing and Grinding 12

At the crushing and grinding facility, the ore is crushed, mixed with water, and ground into a fine powder by various ore crushing and grinding mechanisms, after which it is pumped to a concentration facility. Crushed and ground ore typically contains less than 2 weight percent ("wt %") copper.

C. Concentration 14

At the concentration facility, the crushed and ground ore is concentrated into a slurry liquid concentrate. More specifically, the crushed and ground ore is mixed with water, chemicals, and air in a floatation cell, which causes copper in the crushed and ground ore to stick to air bubbles rising within the flotation cell. As the air bubbles float to the top of the surface of the flotation cell, they are collected to form the liquid concentrate.

Thus, concentration 14 concentrates the crushed and ground ore into slurry liquid concentrate, which typically contains approximately 25-35 wt % copper (and 20-30 wt % water). Using various filters, the concentrate is then dewatered to produce a moist copper concentrate that is amenable to handling by conveyor belts, loaders, rail cars, and the like.

D. Smelting 16

Using heat and oxygen, the concentrate is smelted into a slag and copper-iron sulfide called copper matte. More specifically, the moist concentrate is first dried in a large, rotating drum or similar drying apparatus. Then, it is fed into a smelting process in which the now-dried concentrate is mixed with oxygen-enriched air and blown into a smelting furnace through a concentrate burner. Within the smelting furnace, the now-dried concentrate is exposed to temperatures greater than 2300° Fahrenheit, by which it partially oxidizes and melts due to heat generated by oxidizing sulfur and iron within the molten concentrate.

This process generates the following three products: i) off-gases, ii) slag, and iii) copper matte. The off-gases, which include sulfur dioxide (i.e., $SO_2$), are routed to a waste gas handling system through an off-take riser in the smelting furnace. The slag comprises silica and iron, or more specifically, gangue mineral, flux, and iron oxides, and it has a low specific gravity (i.e., lower density) relative to the copper matte, thus allowing it to float on top of the copper matte. The copper matte, on the other hand, comprises copper sulfide and iron sulfide, and it has a high specific gravity (i.e., higher density) relative to the slag, thus allowing it to form, collect, and sink to a basin or settler located at the bottom of the smelting furnace.

Periodically, the slag is tapped off. More specifically, the slag and copper matte are conventionally separated by skimming the slag from the copper matte through various tap-holes in sidewalls of the smelting furnace. These tap-holes are commonly located at a relatively high elevation on the sidewalls to allow the slag to be removed from the smelting furnace without removing the copper matte. Conversely, various tap-holes for the copper matte are commonly located at a relatively low elevation on the sidewalls to allow the copper matte to be removed from the smelting furnace without removing the slag.

Thus, smelting 16 smelts the liquid concentrate into copper matte, which typically contains approximately 35-75 wt % copper.

E. Conversion 18

After the slag is separated from the copper matte, the copper matte can be i) transferred directly into a conversion furnace, ii) transferred into a holding furnace for subsequent delivery to the conversion furnace, or iii) converted into a solid form by flash-cooling the copper matte in water to form granules, which are stock-piled in a large, enclosed space for subsequent delivery to the conversion furnace. Within the conversion furnace, various remaining impurities are removed from the copper matte, and the result produces a molten copper called blister copper.

There are two basic types of conversion furnaces—namely, flash conversion furnaces and bath conversion furnaces. The purpose of each is to oxidize (i.e., convert) metal sulfides to metal oxides. Representative flash conversion furnaces, which are also known as suspension furnaces, include the flash conversion furnace used by Kennecott Utah Copper Corp. at its Magna, Utah facility. Representative bath conversion furnaces include the bath conversion furnaces used by i) Noranda, Inc. at its Horne, Canada facility; ii) Inco Ltd. at its Sudbury, Canada facility; and iii) Mitsubishi Materials Corp. at its Naoshima, Japan facility.

Regardless of the type of conversion furnace, the copper matte is converted into blister copper within the conversion furnace by the reaction of the copper matte with oxygen. More specifically, in bath conversion furnaces, the molten copper matte is charged into the furnace and air or oxygen-enriched air is blown into the molten copper matte through tuyeres or gas injectors. Silica flux is added to the bath conversion furnace to combine with the iron being oxidized and form the slag.

Flash conversion processes, on the other hand, treat solidified copper matte by first grinding the matte to a suitable size (i.e., a powder) and then blowing this into a flash reaction furnace using oxygen enriched air (ca. 70-90% oxygen). Flux is also added to the powdered matte, typically as calcium oxide, but it may also be silica or a combination of calcium oxide and silica. The powdered matte combusts in the oxygen atmosphere and generates sufficient heat to melt the materials and flux and produce molten blister and slag.

These conversion processes generate the following two products: i) slag and ii) blister copper. The slag comprises gangue mineral, copper metal (i.e., $Cu^0$), copper oxides (principally in the form of $Cu_2O$), flux, and iron oxides, and it has a low specific gravity (i.e., lower density) relative to the blister copper, thus allowing it to float on top of the blister copper. The blister copper, on the other hand, comprises gangue mineral, copper metal (i.e., $Cu^0$), copper oxides (principally in the form of $Cu_2O$), and copper sulfides (principally in the form of $Cu_2S$), and it has a high specific gravity (i.e., higher density) relative to the slag, thus allowing it to form, collect, and sink to a basin or settler located at the bottom of the conversion furnace. While the top slag layer is typically approximately thirty centimeters deep, the bottom blister copper layer is approximately fifty centimeters deep.

If the conversion furnace is a rotary bath conversion furnace, then the slag and blister copper are separately poured from a mouth or spout on an intermittent basis. If, on the other hand, the conversion furnace is stationary bath conversion furnace, then outlets are provided for removing the slag and blister copper. These outlets typically include various tapholes that are located at varying elevations on one or more sidewalls of the conversion furnace, and, in a manner similar to that used with the smelting furnace, each is removed from the conversion furnace independently of the other. Other types of conversion furnaces commonly utilize one or more outlets to continuously overflow the slag and blister copper, using, for example, an appropriate weir to retain the slag.

The phase separation that occurs between the slag and blister copper is not complete. Thus, the slag, as indicated, contains additional copper, which is usually in the form of copper metal (i.e., $Cu^0$) and copper oxides (principally in the form of $Cu_2O$), while the blister copper contains various waste and un-recovered minerals (e.g., sulfur), which are principally in the form of copper oxides (principally in the form of $Cu_2O$), copper sulfides (principally in the form of $Cu_2S$), and ferrosilicates, etc. The copper that is in the slag has a lost metal value, which can be recovered by recycling the slag back to the smelting furnace, while the waste and un-recovered mineral values in the blister copper constitute impurities that are eventually removed in either an anode furnace or through electrorefining.

Thus, conversion 18 converts the copper matte into blister copper, which typically contains more than 98 wt % copper.

F. Refinement 20

Finally, the blister copper is refined, usually first pyrometallurgically and then electrolytically. More specifically, the blister copper is subjected to an additional purification step to further up-grade the copper content, such as fire refining in a reverberatory or rotary anode furnace. Then, the blister copper is cast into large, thick plates called anodes, which are often transferred from an anode casting plant to the electrolytic copper refinery by truck, rail, or the like. In the electrolytic copper refinery, the anodes are lowered into an acidic solution that contains approximately 120-250 gpl of free sulfuric acid and approximately 30-50 gpl of dissolved copper. Then the anodes are electrically connected to a positive direct current supply. To electrolyze the anodes in this aqueous electrolyte, they are separated by insoluble, interleaved stainless steel blanks called starter sheets or cathodes, which are negatively charged. Electricity is then sent between the anodes and cathodes for a pre-determined length of time, causing copper ions to migrate from the anodes to the cathodes to form plates at the cathodes, which contain less than 20 parts per million impurities (i.e., sulfur plus non-copper metals, but not including oxygen). Voltages of approximately 0.1-0.5 volts are generally sufficient to dissolve the anodes and deposit the copper on the cathodes, with corresponding current densities of approximately 160-380 amps/m$^2$. With each anode producing two cathode plates at which the refined copper is deposited, the cathodes are then washed and ready for an ultimate end use.

In a typical copper refinery producing 300,000 tons of copper cathode per year, there can be as many as 1,440 electrolytic cells, each with 46 anodes and 45 cathode blanks, for a total of 131,000 pieces suspended into the cells. In such a traditional copper refinery, each cathode and each anode is electrically connected to the refinery current supply system through two or more contact points on the supporting ears of the anodes and the hanger bars of the cathodes. This means there can be a total of over 260,000 electrical connections (i.e., two per anode and two per cathode multiplied by the number of cathodes and anodes). Critical to the efficient operation of the refining process is the absence of short circuits between the anodes and cathode blanks. As subsequently elaborated upon, short circuits can occur if the anodes and cathodes are mis-aligned or if copper deposits on the cathode grow in a non uniform manner and contact the anode. When short circuits do occur, the desired copper plating process is disrupted and the efficiency of electrical use decreases. Accordingly, the short circuits result in decreasing the voltage differential across the anodes and cathodes.

Critical to the efficient operation of the refining process is the absence of open and short circuits between the anodes and cathodes. As subsequently elaborated upon, short circuits can occur if the anodes and cathodes are mis-aligned or if copper deposits on the cathode grow in a non-uniform manner and contact the anode. When short circuits do occur, the desired copper plating process is disrupted. Open circuits, on the other hand, can occur if there is poor contact between the current supply and the anodes or cathodes. When open circuits do occur, the efficiency of electrical use decreases.

Thus, refinement 20 refines the blister copper into refined copper, which typically contains approximately 99.99 wt % copper (i.e., effectively, pure copper).

Thereafter, refinement 20 allows the refined cathode copper to be converted into any number of copper end-products using conventional methods and techniques, which are well-known in the art.

The efficiency of copper refinement 20 can be increased by increasing the efficiency of cell monitoring. More specifically, at least one important cell parameter needs to be closely monitored—namely, electrical current flow through each individual cathode in the electrolytic cell. Failure to adequately monitor this cell parameter, and others, can reduce metal recovery, increase scrap rate, and lead to inefficient energy utilization. Nevertheless, open and short circuits commonly occur during the electrolytic refining of copper. They occur for many reasons, including i) poor anode and cathode physical qualities, ii) poor contact between the current supply and the anodes or cathodes, iii) misalignment of anodes and cathodes, and iv) localized variations in electrolyte temperature, additive levels, or chemistry. Thus, efficient electrolytic cell monitoring is important during the electrolytic refining of copper, as it can enable system operators to detect open and short circuits between anodes and cathodes, which, if not corrected, reduce current efficiencies and result in downstream processing problems, such as poor cathode development. As known, copper impurity, copper content, and copper appearance are also ultimately adversely affected by open and short circuits.

Conventional monitoring focused on only identifying short circuits between the anodes and cathodes. This was commonly accomplished by manually using a hand-held Gauss meter to detect abnormal magnetic fields flowing through the cathode. Such a procedure generally required physically walking over the anodes and cathodes in each cell while closely observing the hand-held Gauss meter to detect a large deflection in a meter needle. Oftentimes, the Gauss meter was affixed to a distal end of a long stick or pole, whereby it can then be held close to the cathode hanger bar. Regardless, the task was both ergonomically difficult and accident-prone. Moreover, walking on the cells frequently misaligned the anode and cathodes, could lead to possible contamination, and often lead to further problems as well.

Since shorts generate heat, newly-developed techniques have involved using infrared cameras and image processing techniques. However, like the traditional Gauss meter techniques, these generally only detect short circuits and not open circuits.

While detecting open and short circuits deals with their effects rather than their causes, it is a widely recognized technique for improving electrode quality. Accordingly, after a short circuit is detected, it is generally cleared by probing between the anode and cathode with a stainless steel rod to locate the fault and then physically separating (i.e., breaking off) an errant copper nodule growing at the epicenter of the short circuit. This often requires physically lifting the cathode out of the cell. Unfortunately, however, many open and short circuits are not often detected until after significant damage has already occurred.

Consequently, there is a need for an improved electrolytic cell current monitoring device and method, which detect not only short circuits, but open circuits as well. Such a device and method will increase energy utilization and efficiency during the copper refinement stage 20 of producing copper. Thus, a need exists for effective monitoring electrolytic cell currents during the copper refinement stage 20 of producing copper.

SUMMARY OF THE INVENTION

An apparatus comprises sensors that measure magnetic field strength generated about a conductor adapted to carry electrical current to or from an electrolytic cell. The apparatus also comprises a processor in electrical communication with the sensors for determining a compensated magnetic field strength generated about the conductor by compensating the magnetic field strength for other magnetic fields generated by other conductors that are adapted to carry electrical current to or from the electrolytic cell. In one embodiment, this apparatus further comprises means for identifying short and open circuits between anodes and cathodes of the electrolytic cell based on the cathode electrical current. In another embodiment, the shorts and opens can be identified by comparing the cathode electrical currents to predetermined values. In one embodiment, the sensors are Hall Effect sensors. In another embodiment, the apparatus includes multiple sensors for each cathode of the electrolytic cell. In another embodiment, the apparatus comprises means for communicating the compensated magnetic field strength to a central control unit. In another embodiment, the apparatus is a hand-held, pole, rail car, robot, or crane device. In another embodiment, the apparatus further comprises a proximity sensor in electrical communication with the sensors for activating the sensors when the apparatus is in close physical proximity to the conductors.

A method comprises providing sensors adapted to measure magnetic field strength generated about a conductor wherein the conductor is adapted to carry electrical current to or from an electrolytic cell. The method also comprises determining a compensated magnetic field strength generated about the conductor by compensating the magnetic field strength for other magnetic fields generated by other conductors adapted to carry electrical current to or from the electrolytic cell. In one embodiment, the method determines cathode electrical current carried by the conductor based on the compensated magnetic field strength. In another embodiment, the method further comprises identifying short and open circuits between anodes and cathodes of the electrolytic cell based on the cathode electrical current. In another embodiment, the method further comprises identifying open and short circuits based on comparing the cathode electrical current to predetermined thresholds. In another embodiment, the sensors are Hall effect sensors. In another embodiment, the method further comprises providing a sensor for each cathode of the electrolytic cell. In another embodiment, the method further comprises communicating the compensated magnetic field strength to a central control unit. In another embodiment, the method further comprises providing the sensors via an apparatus that is a hand-held, pole, rail car, robot, or crane device.

BRIEF DESCRIPTION OF THE SEVERAL VIEWS OF THE DRAWINGS

A clear conception of the advantages and features constituting inventive arrangements, and of various construction and operational aspects of typical mechanisms provided therewith, will become readily apparent by referring to the following exemplary, representative, and non-limiting illustrations, which form an integral part of this specification, wherein like reference numerals generally designate the same elements in the several views, and in which.

DETAILED DESCRIPTION OF PREFERRED EMBODIMENTS

Figure 2:
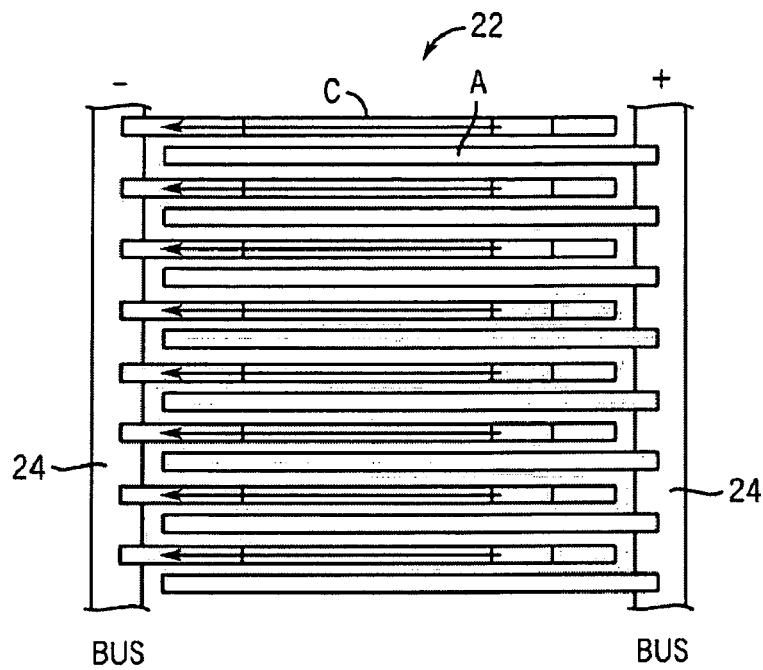
FIG. 2 is a top view of an electrolytic cell.

Referring now to FIG. 2, an electrolytic cell 22 is shown in which anode plates (i.e., "anodes") A and cathode sheets (i.e., "cathodes") C are alternately arranged close to one another and immersed in an aqueous electrolyte (not shown). During copper production, the anodes A and cathodes C are in ear-contact with positive and negative current rails 24 that run lengthwise of the electrolytic cell 22. When the anodes A are connected to the positive (+) current rail 24 and the cathodes C are connected to the negative (−) current rail 24, the current rails 24 carry electrical current to the electrolytic cell 22 to assist in copper ion migration from the anodes A to the cathodes C. More specifically, electricity is sent between the positively charged anodes A and the negatively charged cathodes C for a pre-determined length of time, which causes copper ions to migrate from the anodes A to the cathodes C to form plates at the cathodes C according to the following equation:

$$C_m^{++} + 2e^- = C_u^0$$

Figure 3:
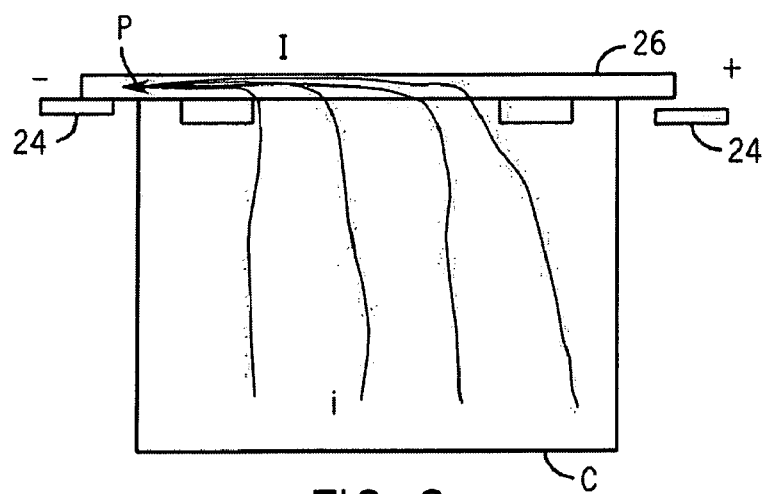
FIG. 3 is front view of a single cathode sheet from FIG. 2.

Referring now to FIG. 3, electrical current (i) is formed in the cathodes C as the copper ions migrate from the anodes A to the cathodes C. As shown, these individual electrical currents (i) flow up the cathode C to form at a copper bar 26 from which the cathode C depends. These electrical currents (i) flow along the copper bar 26 towards the negative current rail 24. A summation total of all of these electrical currents (i) at a point P that is physically close to the negative current rail 24 approximates the cathode electrical current (I) collected by a particular cathode C.

If no open circuits or short circuits exist between the anode A and cathode C, then the rate of copper plated on the cathode C will be in direct proportion to the cathode electrical current (I), as expressed by either of the following equivalent equations:

$$dCu/dt = I/840 \text{(kg/hour)}$$

or $$dCu/dt = 0.0026I \text{(lb/hour)}$$

Figure 4:
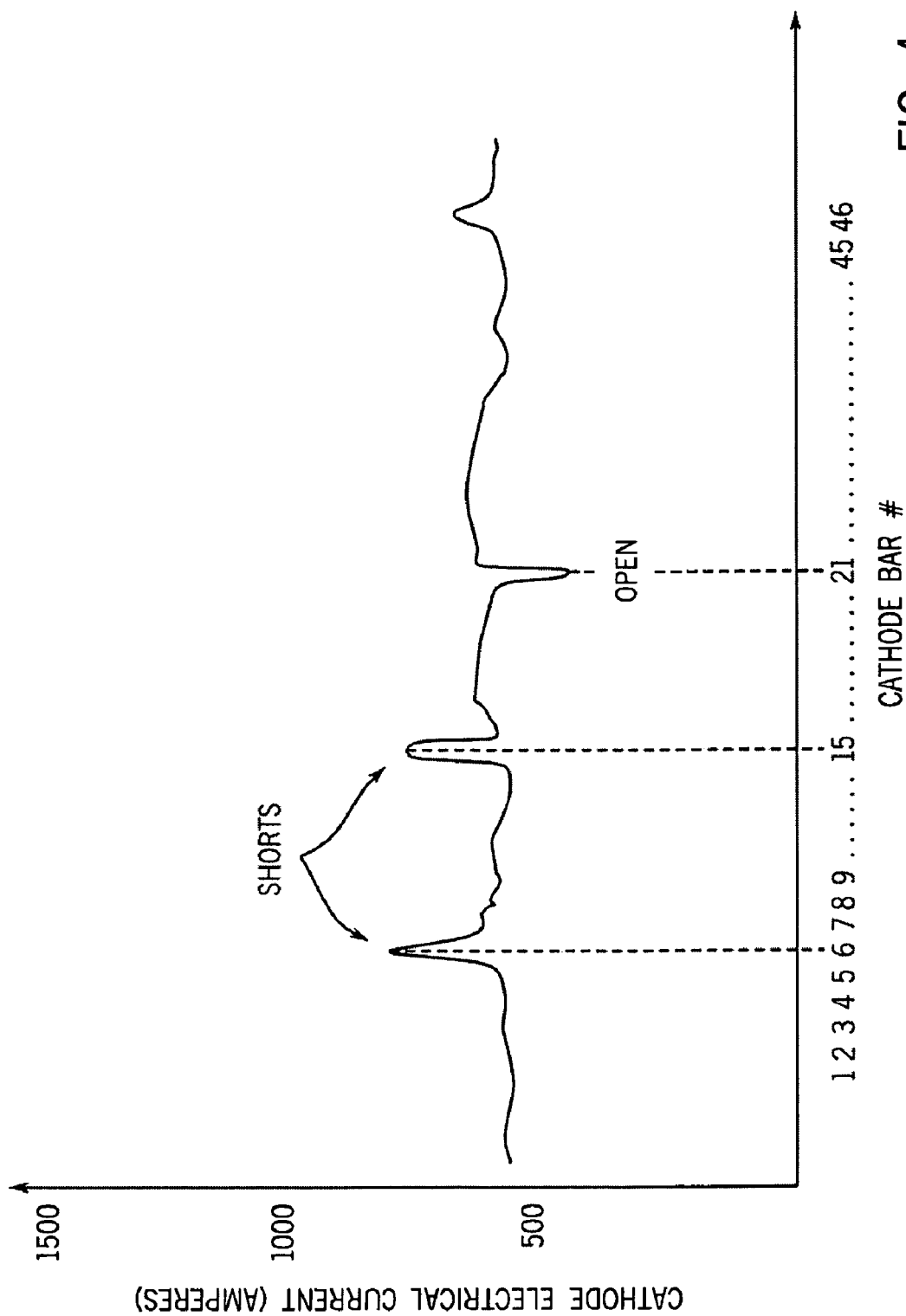
FIG. 4 is a continuous graph of electrical currents for the cathodes of an electrolytic cell experiencing open and short circuits.

Referring now to FIG. 4, a comparatively large cathode electrical current (I) is produced if a short circuit (aka as a "short") develops between the anode A and cathode C. This is reflected as a current spike. A short condition decreases copper production because the copper ions cannot successfully migrate from the anodes A to the cathodes C. Accordingly, insufficient copper is plated at the cathode C.

Likewise, a comparatively small cathode electrical current (I) is produced if an open circuit (aka as an "open") develops between the anode A and cathode C. This is reflected as a current drop. Instead of assisting the copper ion migration from the anodes A to the cathodes C, an open condition decreases current efficiency, as electrical current is turned into wasted heat at the current rails 24.

Current spikes and current drops are detected by measuring the cathode electrical current (I) at the point P near the negative current rail 24 for each cathode C of the electrolytic cell 22. For example, with each individual cathode C plotted along the x-axis and cathode electrical current (I) measured in Amperes plotted along the y-axis in FIG. 4, shorts can be readily identified at cathodes 6 and 15, while opens can be readily identified at cathode 21. More specifically, electrical current spiked (e.g., approximately 750 amps or greater) significantly above a baseline (e.g., approximately 525 amps) at cathodes 6 and 15, indicating the existence of short circuits between the respective anodes A and cathodes C. Likewise, electrical current dropped (e.g., approximately 300 amps or less) significantly below the baseline (e.g. approximately 525) at cathode 21, indicating the existence of an open circuit between the respective anode A and cathode C. In this example, a cathode electrical current (I) of approximately 525 amps, for example, represented effective copper ion migration from the anodes A to the cathodes C of the electrolytic cell 22. This is the average electrical current (I) that a typical cathode C ideally shares out of the total electrical current flowing across the electrolytic cell 22. Accordingly, the magnitude of relative deviations from this 525 amp baseline can also be used to indicate the severity of the open circuit or short circuit between a specific anode A and cathode C.

Figure 5:
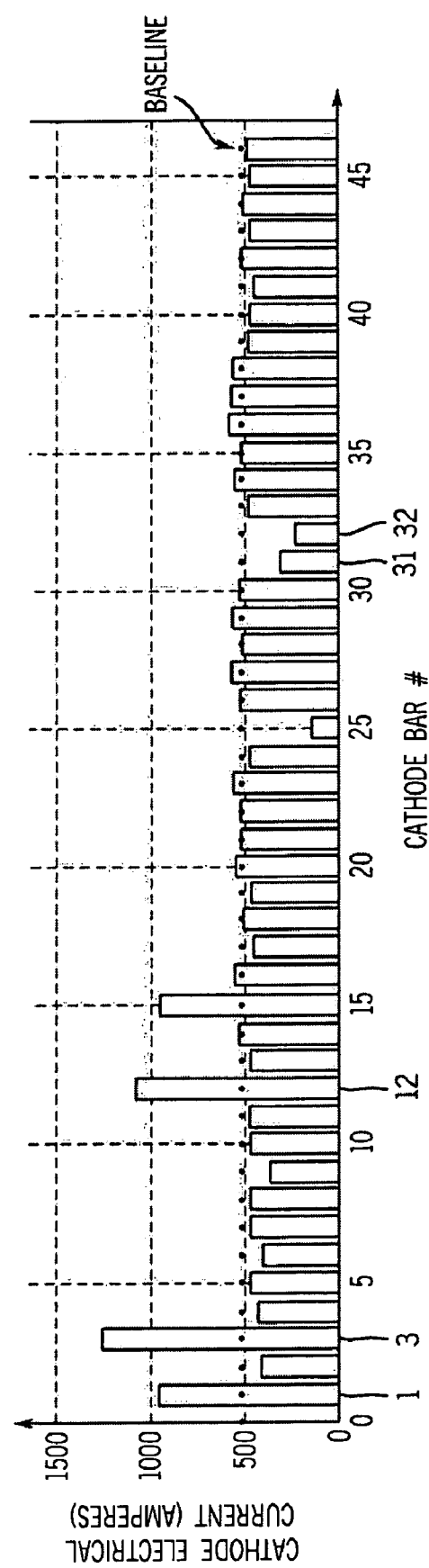
FIG. 5 is a detailed graph of electrical currents for each individual cathode in an electrolytic cell in which certain cathodes are experiencing open or short circuits.

Referring now to FIG. 5, it also plots each cathode C along the x-axis and cathode electrical current (I) measured in Amperes along the y-axis. As seen in FIG. 5, the same 525 amp baseline is plotted to represent effective copper ion migration. However, comparatively large deviations therefrom now represent ineffective copper ion migration. For example, the cathode electrical current (I) at cathodes 1, 3, 12, and 15 rose significantly above the baseline, indicating the presence of a short circuit. Likewise, the cathode electrical current (I) at cathodes 25, 31, and 32 dropped significantly below the baseline, indicating the presence of an open circuit. These deviations from the baseline, like in FIG. 4, indicate ineffective copper ion migration from the anodes A to the cathodes C. The relative severity of the open or short between the anode A and cathode C can also be identified. In any event, this electrolytic cell 22 is no longer considered to be in acceptable or good working status, and action is needed to correct the situation, such as clearing the fault by separating (i.e., breaking off) an errant copper nodule growing at the epicenter of a short circuit, which may require physically removing the cathode C from the electrolytic cell 22, or re-establishing good contact between the current rails 24 and the anodes A or cathodes C.

Figure 6:
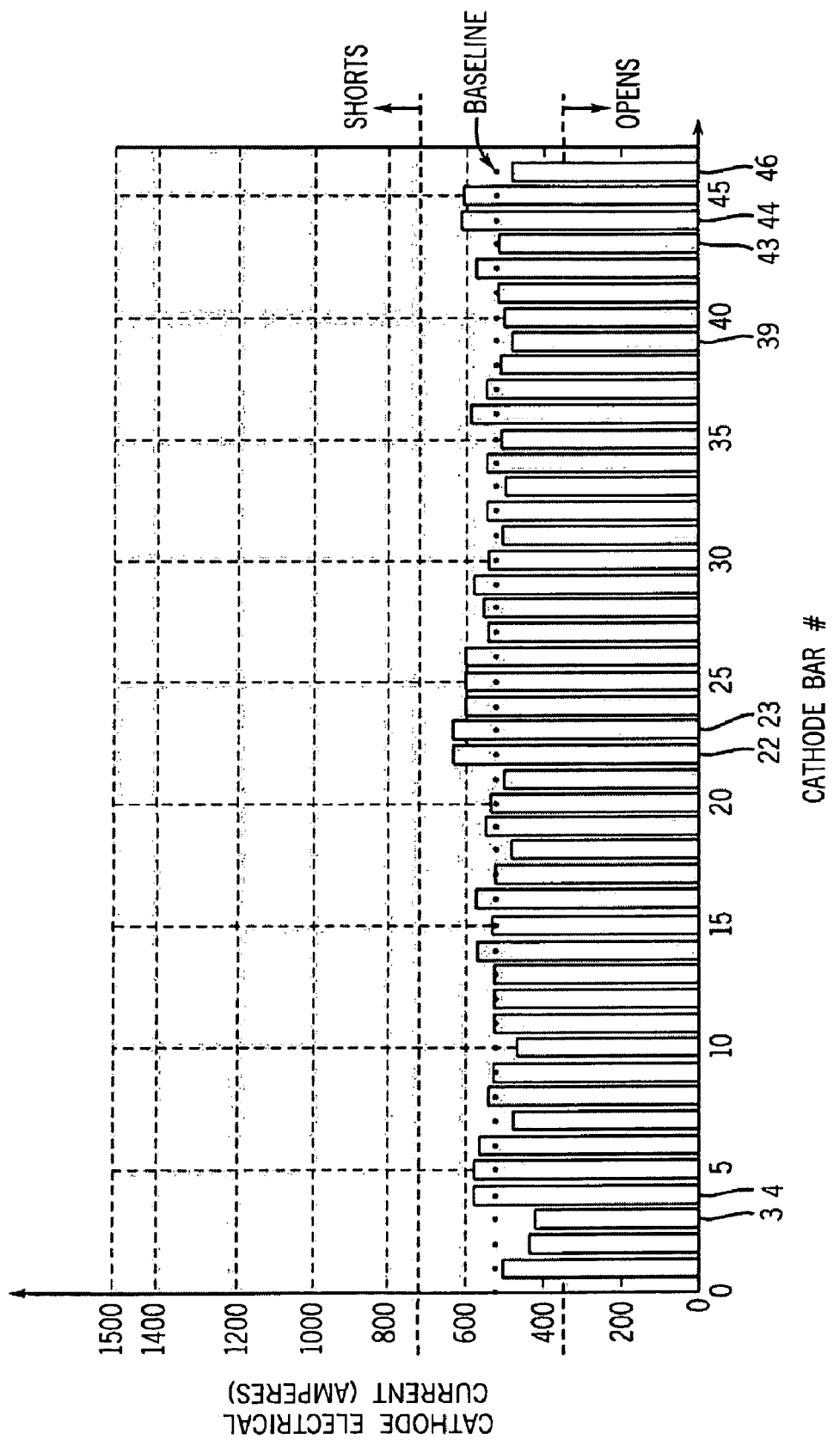
FIG. 6 is a detailed graph of electrical currents for each individual cathode in an electrolytic cell in which each cathode is in good working condition.

Referring now to FIG. 6, it also plots each cathode C along the x-axis and cathode electrical current (I) measured in Amperes along the y-axis. As seen in FIG. 6, the same 525 amp baseline is again plotted to represent effective copper ion migration. Relatively small deviations therefrom, however, can still represent effective copper ion migration. For example, while the cathode electrical current (I) at cathodes 4, 5, 22, 23, 44, and 45 (and others) rose above the baseline, the spike was not severe enough to identify the presence of a short circuit. Likewise, while the cathode electrical current (I) at cathodes 3, 39, 43, and 46 dropped below the baseline, the drop was not severe enough to identify the presence of an open circuit. While remaining within tolerable drifts from this baseline, this electrolytic cell 22 can still be considered to be in acceptable or good working status. In normal situations, the cathode electrical current (I) randomly fluctuates around the baseline. It can be considered to be in normal operating condition as long as the random fluctuations are contained with a desired boundary or range of thresholds.

Setting acceptable threshold parameters and tolerable deviations from the baseline can be based on statistical sampling, as chosen and well-known by those skilled in the art and representatively shown by dashed horizontal lines surrounding the 525 amp baseline in FIG. 6. These can be chosen as a matter of preference for a particular tank house. In any event, they effectively delineate the parameters or conditions that trigger open circuit and short circuit identification between the anodes A and cathodes C of the electrolytic cell 22. Minor deviations therewithin are tolerated as acceptable and not inhibiting effective ion migration from the anode A to the cathodes C, thereby requiring no user interaction.

Figure 7:
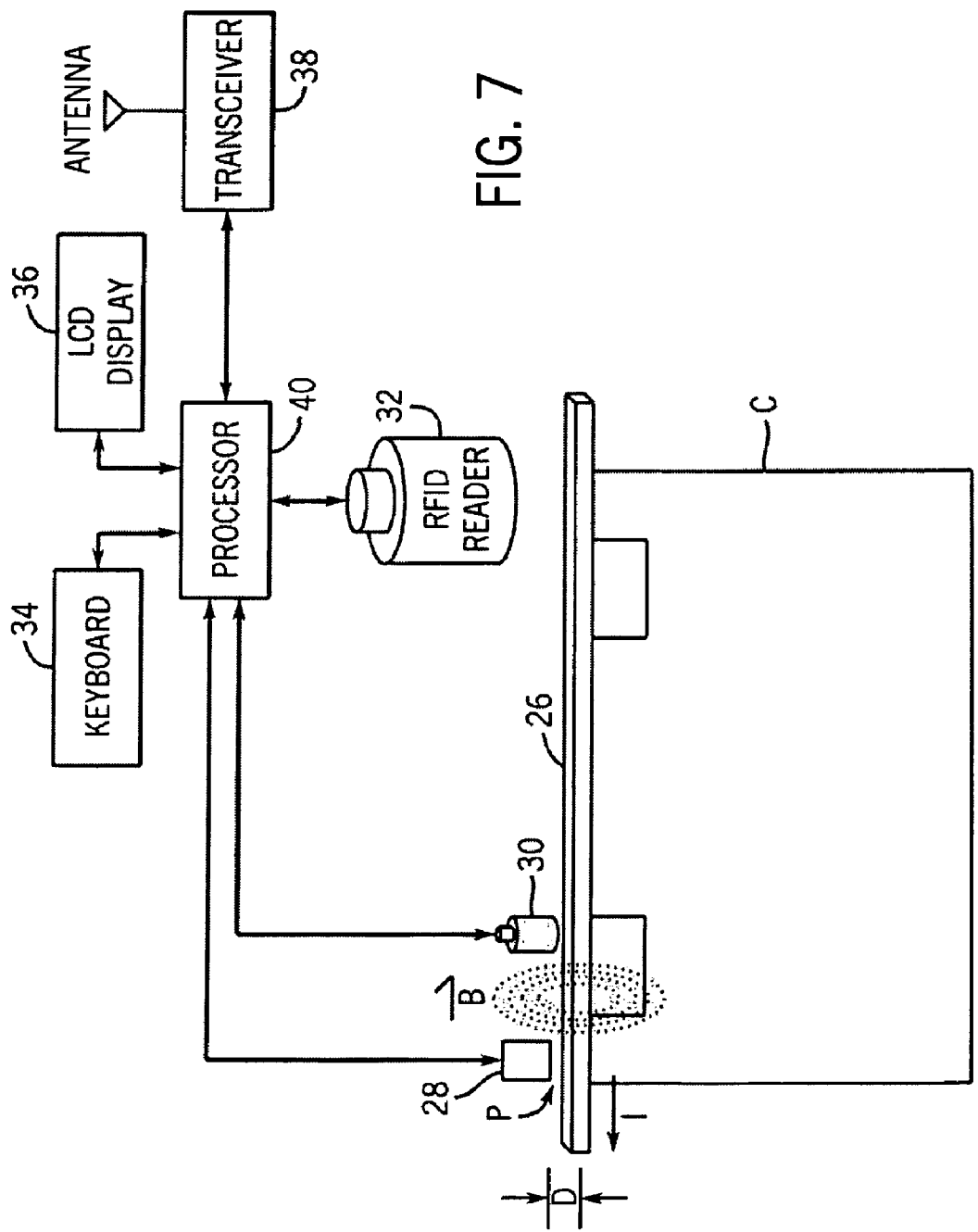
FIG. 7 is a functional overview of a partial architecture implementing the inventive arrangements.

As previously described, an electrical current (i) is formed as the copper ions migrate from the anodes A to the cathodes C, yielding a cathode electrical current (I) at point P near the copper bar 26. As is well-known, this cathode electrical current (I) creates a magnetic field B according to the following equation:

$$B = \frac{\mu_0 I}{2\pi d}$$

where $\mu_0$ is the permeability constant, I is the cathode electrical current (I) at the copper bar 26 at point P, d is the distance from the copper bar 26 to the measurement point P of the magnetic field B, and B is the strength of the magnetic field induced by cathode electrical current (I) at point P. As can be seen, stronger cathode electrical currents (I) generate stronger magnetic fields B, and the cathode electrical current (I) can be determined by re-arranging the above equation and measuring the strength of this magnetic field B:

Referring now to FIG. 7, a Hall Effect sensor 28 measures the strength of this magnetic $$I = \frac{2\pi d B}{\mu_0}$$

field B. More specifically, a typical Hall Effect sensor 28 utilizes a small platelet made of semi-conductive material. Within the three dimensions of space, if an electrical current (I) passes through this platelet perpendicular to the direction of the external magnetic field B, it creates an analog output voltage (aka a Hall voltage), which is generated perpendicularly to the cathode electrical current (I) and the magnetic field B. This phenomena is known as the Hall Effect, and the Hall voltage depends on the product of the cathode electrical current (I) multiplied by the amplitude of the magnetic field B as measured by the magnetic flux density of the platelet. In any event, the linear Hall Effect sensor 28 measures the Hall voltage in proportion to the magnetic flux that is perpendicular to the platelet of the Hall Effect sensor 28. In any event, a Hall Effect sensor 28 can be provided for every cathode C in the electrolytic cell 26.

Referring again to FIG. 3, the cathode electrical current (I) for each of the cathodes C can be summed together to represent an overall section current ($I_S$) for the entire electrolytic cell 22. Knowing this section current ($I_S$) and the number of cathodes C in the electrolytic cell 22, the readings from the Hall Effect sensors 28 of FIG. 7 can be normalized to set the baselines for the electrolytic cell 22, according to the following equation:

$$I_i = \frac{B_i - B_0}{\sum_{k=1}^{N}(B_k - B_0)} I_S$$

where N is the number of cathodes C in the cell, $I_S$ is the overall section current for the entire electrolytic cell 22, $I_i$ is cathode electrical current (I) flowing through cathode (i), $B_i$ is the reading of the Hall Effect sensor 28 for cathode (i), and $B_0$ is the Quiescent Hall Effect sensor reading of the Hall Effect sensor 28 when B=0.

Figure 8:
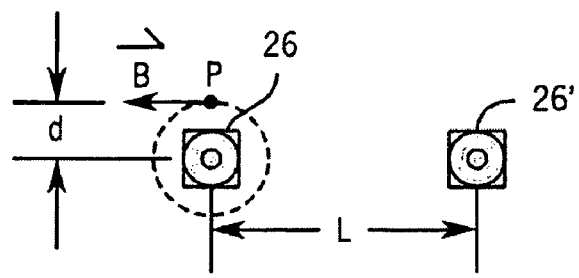
FIG. 8 is a partial side view of two (2) adjacent cathodes with a relatively large L/d ratio.

Referring now to FIG. 8, a simplified, partial side view of two (2) adjacent cathodes C in the electrolytic cell 22 is shown. As previously described, a cathode electrical current (I) flows along the copper bar 26 from which each cathode C depends. This cathode electrical current (I) generates a magnetic field B, which forms in a circular fashion around the copper bar 26 of the cathode C. If a measurement of this magnetic field B is taken at point P when P is sufficiently close to the copper bar 26, then the magnetic field B generated by the cathode electrical current (I) through this copper bar 26 is horizontal and perpendicular to other magnetic fields B' generated by other currents (I') through other copper bars 26' that run parallel to the copper bar 26 of interest. In other words, where L is the distance between cathodes C (e.g., approximately 10 cm) and d is the distance from the cathode C to a point P where a measurement is taken by a Hall Effect sensor 28 (e.g., approximately 0.5 cm), then L/d is significantly large. Accordingly, the magnetic field B about the copper bar 26 is decoupled at this point P from other magnetic fields B' about other copper bars 26'. Increasingly greater L/d ratios further decouple these interacting magnetic fields B and B'. However, within the typical electrolytic cell 26, L is a fixed constant, so the traditional way to keep L/d sufficiently large has been to take Hall Effect sensor 28 measurements at points P that were very close to the copper bar 26 of interest. This assured that the magnetic field B(n) generated at a cathode C(n) was due only to the cathode electrical current (I) at that cathode C(n).

Figure 9:
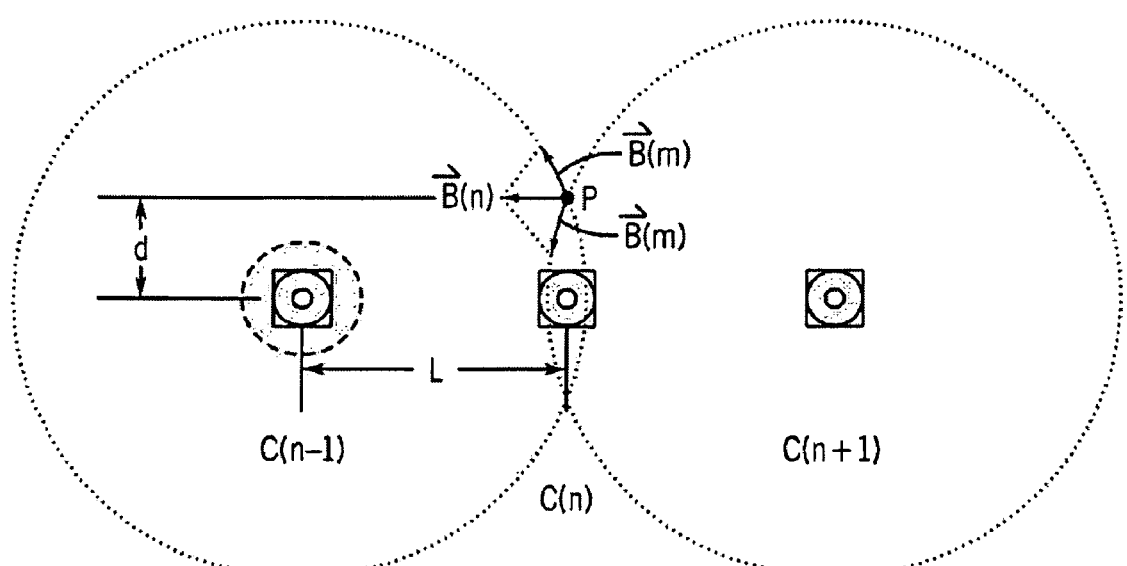
FIG. 9 is a partial side view of three (3) adjacent cathodes with a relatively small L/d ratio.

Referring now to FIG. 9, L/d is not as comparatively large. Accordingly, the magnetic field B(n) at point P(n) is the result of the magnetic field B(n) generated by cathode C(n) plus the summation of the horizontal components of the fields B(m) generated by other nearby cathodes C(m), m≠n. In other words, the horizontal component of the magnetic field B(n) at point P(n) is no longer solely generated by the cathode electrical current (I) generated at cathode C(n). Instead, it contains contributions from the horizontal components from other cathodes C(m) on both sides of the cathode C(n) that the Hall Effect sensor 28 is measuring. As a result, the strength of the magnetic field B(n) measured by the Hall Effect sensor 28 at point P(n) is biased. And the bias is not the same for all cathodes C. For example, cathodes C at either end of the electrolytic cell 22 receive less contribution from neighboring cathodes C(m) because there are fewer of these neighboring cathodes C(m). Likewise, cathodes C near neighboring cathodes C(m) that are experiencing a short circuit or open circuit receive more or less contribution from these neighboring cathodes C(m) due to their electrical current instabilities. Thus, a compensation process is need to accurately measure the magnetic field B(n) at each individual cathode C(n) of the electrical cell 22 to ascertain an accurate measurement of the cathode electrical current (I) thereat.

Figure 10:
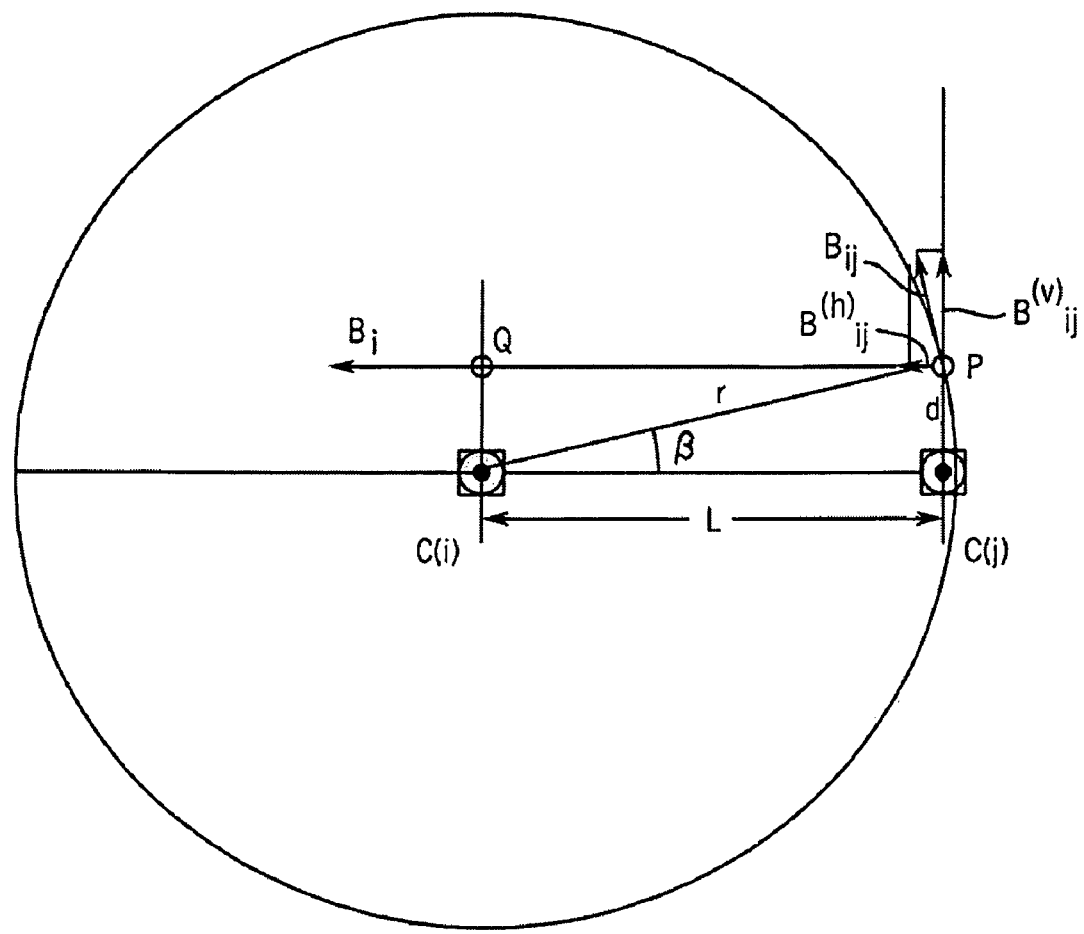
FIG. 10 is a partial side view of two (2) adjacent cathodes with magnetic field compensation.
Figure 11:
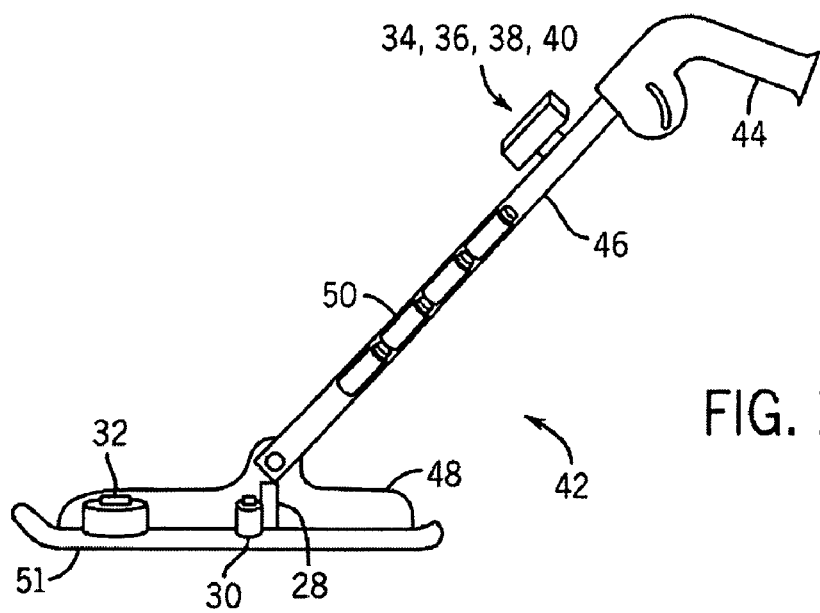
FIG. 11 is a partial cross-sectional view of a hand-held device according to a first embodiment of the invention.

Referring now to FIG. 10, two (2) adjacent cathodes C(i), C(j) are depicted. By definition, the two cathodes C(i), C(j) are one cathode distance L apart. To calculate the horizontal component of the magnetic field B(i) generated by the cathode C(i) at the measuring point P(i) on top of the neighboring cathode C(j), let B(i) be the magnetic field strength generated solely by the cathode electrical current (I) in cathode C(i) and measured at point Q(i) above cathode C(i). Because the magnetic field strength B is inversely proportional to the distance d between the cathode C and the observation point, the magnetic field B(i) generated by cathode C(i) at point P(i) above cathode C(j) is calculated by the magnetic field B(i) according to the following equation:

$$B_{ij} = \frac{d}{\sqrt{L^2 + d^2}} B_i$$

The horizontal component of $B_{ij}$ is calculated according to the following equation:

$$B_{ij}^{(h)} = B_{ij}\sin(\beta) = \frac{d}{\sqrt{L^2 + d^2}} B_{ij}$$

Accordingly, $$B_{ij}^{(h)} = \frac{d^2}{L^2 + d^2} B_i$$

Because $$\frac{d^2}{L^2 + d^2} \gg 1$$

as a first order estimation, B(i) can be substituted by the measurement at point Q by the Hall Effect sensor 28, which contains the horizontal field components generated by other cathodes other than C(i).

The above equation is the horizontal component of the magnetic field generated by the cathode C that is one cathode distance L apart. Assuming the distance between any two adjacent cathodes C is the same, say L, then the horizontal component of the field generated by the cathode C(i) at cathode C(k) is given by the following equation:

$$B_{ik}^h = \frac{d^2}{[(k-i)L]^2 + d^2} B_i$$

Let $$\lambda_{ik} = \frac{d^2}{[(k-i)L]^2 + d^2}.$$

This is the field coefficient of the horizontal component contributed by the cathode C(i) at cathode C(k).

With this notation, $B^h_{ik} = \lambda_{ik} B_i$

Now for the following raw data, $B = [B_1, B_2, B_3, \ldots B_N]$, B(i) is the field strength read from the Hall Effect sensor 28 at cathode C(i).

And for the following compensated data, $B_c = [B^c_1, B^c_2, B^c_3, \ldots B^c_N,]$, where $B^c_i$ is the compensated field strength of B(i). It represents the true or real field strength generated by the cathode electrical current flow (I) through C(i).

Let $\lambda_{ik}$ be the coefficient of magnetic field contribution of the $i^{th}$ cathode to the $k^{th}$ cathode. Then, the coefficients $\lambda_{ik} \ll 1$ are small numbers. Accordingly, the first order estimation is given by the following equation:

$$B_i^c = B_i - \left[\sum_{k=1}^{i-1} \lambda_{ki} B_k + \sum_{k=i+1}^{N} \lambda_{ki} B_k \right] = B_i - \sum_{k=1, k \neq i}^{N} \lambda_{ki} B_k$$

Then, $$B_c = \left[B_1 - \sum_{k=2}^{N} \lambda_{ki} B_k, B_2 - \lambda_{12} B_1 - \sum_{k=3}^{N} \lambda_{k2} B_k, \ldots B_N - \sum_{k=1}^{N-1} \lambda_{kN} B_k\right],$$

where $\lambda_{ik} = \frac{d^2}{[(k-i)L]^2 + d^2}$.

And $\lambda_{ik}$ has the following properties:

$$\lambda_{ik} = \frac{d^2}{[(k-i)L]^2 + d^2} = f(|k-i|)$$

$$\lambda_{ik} = \lambda_{ki}$$

$$\lambda_{ik} = \lambda(m), \quad m = |i - k| = 1, 2, \ldots N - 1$$

$$\lambda_{ik} = \frac{d^2}{(mL)^2 + d^2}$$

These relations greatly simplify the calculations on the magnetic field compensation. Because λ(m) decreases very rapidly as m increases, a few terms is sufficient when calculating the compensated values.

Now, cathode current can be calculated using compensated data according to the following equation:

$$I_i = \frac{B_i^c - B_0}{\sum_{k=1}^{N}(B_k^c - B_0)} I_S$$

where N is the number of cathodes C in the cell, $I_S$ is the overall section current for the entire electrolytic cell 22, $I_i$ is cathode current flow (I) through cathode (i), $B^c_i$ is the compensated field strength generated by cathode (i), and $B_0$ is the Quiescent Hall Effect sensor reading of the Hall Effect sensor 28 when B=0.

In addition, the magnetic field is a vector having the following three (3) components: B(x), B(y), and B(z). One component has been described: the horizontal component. Two and three dimensional field vectors can also be measured using multiple (i.e., two or three) Hall Effect sensors 28 mounted perpendicularly to each other respectively. Such field vectors can provide increased measurement and compensation, as understood by those skilled in the art. For example, two (2) Hall Effect sensors 28 mounted at 90° relative to one another can measure the magnetic field strength vector. The direction of the magnetic field B will provide information about on which side of the cathode C the open or short occurred, which is an indication of the problematic anode A (i.e., on the, say, north or south side of the cathode C). Moreover, two (2) sets of those Hall Effect sensors 28 mounted at 90° relative to one another may provide information about specifically where on the cathode C the open or short may have occurred by applying basic-trigonometric principles.

Referring again to FIG. 7, a proximity sensor 30 can also be provided in electrical communication with the Hall Effect sensor 28 to detect when the Hall Effect sensor 28 is in close, physical proximity to the copper bar 26 of a cathode C. This capacitance proximity sensor 30 is turned on when it approaches the copper 26 of a cathode C and turned off when it moves away from the same. Accordingly, the proximity sensor 30 is used to synchronize the Hall Effect sensor 28 so that the output thereof will be monitored only when it is very close to a cathode C.

In a preferred embodiment, the proximity sensor 30 is also aligned with the Hall Effect sensor 28 so that they are both aligned with the copper bars 26 of the cathodes C of an electrolytic cell 22 as a device incorporating the same measures the cathode electrical currents (I) of the electrolytic cell 22.

Ordinarily, the Hall Effect sensor 28 is operated as close to the copper bars 26 as possible, although this need is obviated by the magnetic field B compensation techniques of this invention.

In a preferred embodiment, the proximity sensor 30 also functions as a counter, so that an incorporating device knows which cathode C it is measuring and when it finishes measuring a given electrolytic cell 22 as the device moves across the cathodes C of the electrolytic cell 22. Either alternatively or in conjunction therewith, a radio frequency identification ("RFID") reader 32 can also be provided to read RFID tags (not shown) or the like attached to the electrolytic cell 22. In such an embodiment, an operator could avoid manually inputting other identification information about a particular electrolytic cell 22, although a keyboard 34 and LCD display 36 or the like can also be provided for such purposes.

In a preferred embodiment, the data collected about the electrolytic cell 22 can also be transmitted to a central computer and database (not shown) for further processing of the same through an appropriate transceiver 38, and communication between one or more of these components can be coordinated through an appropriate processor 40.

Figure 1:
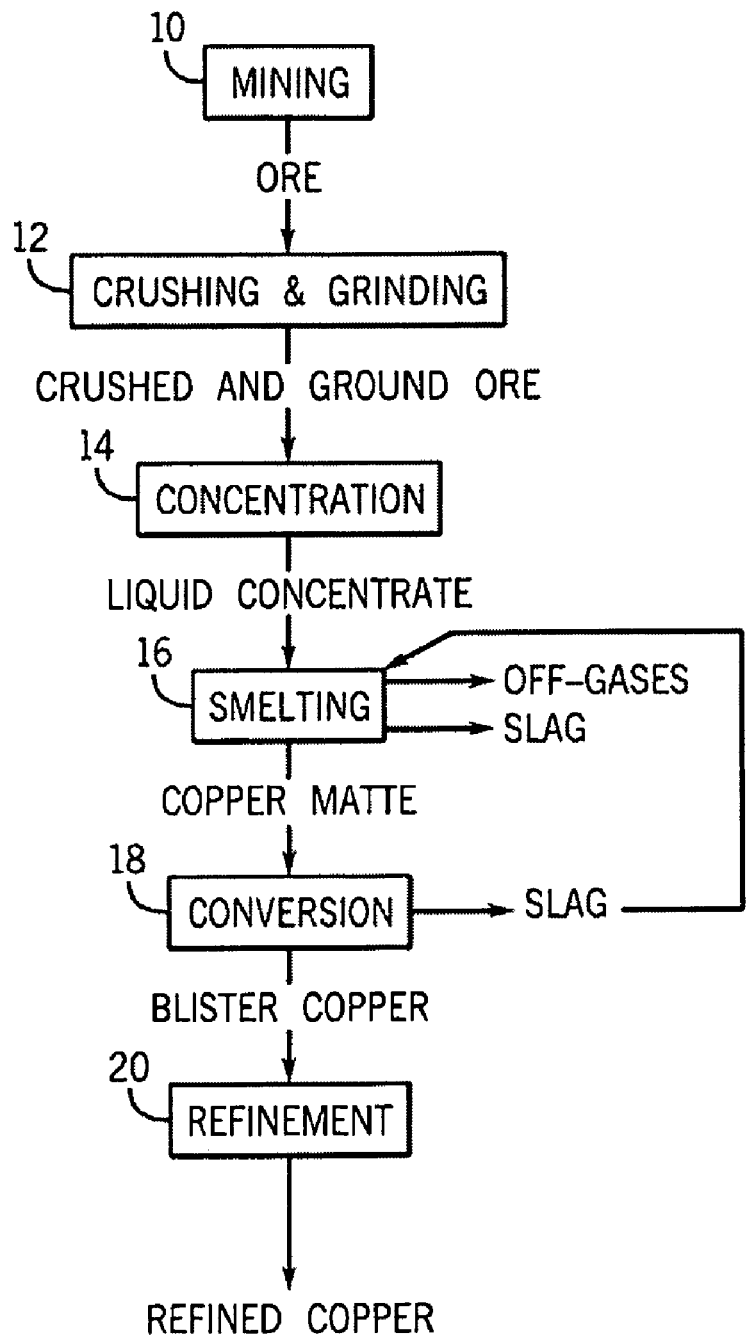
FIG. 1 is a flow chart of electrometallurgical copper production.

Referring now to FIG. 1, a hand-held device 42 embodies a first preferred embodiment of the invention, in which an operator handle 44 connects to a shaft 46 which connects to a measurement head 48, the measurement head 48 containing one or more of the Hall Effect sensor 28, the proximity sensor 30, or the RFID reader 32. The hand-held device 42 may be powered by a rechargeable battery pack 50 therewithin the shaft 46, or by an AC power source (not shown) connected through the handle 44, or otherwise. In addition, a bottom of the measurement head 48 of the hand-held device 42 may include one or more guide sleds 51 or supporting objects or the like so that a consistent distance can be obtained between the Hall Effect sensor 28 and the cathode bar 26 of the electrolytic cell 22 to further enhance measurement accuracy.

Figure 12:
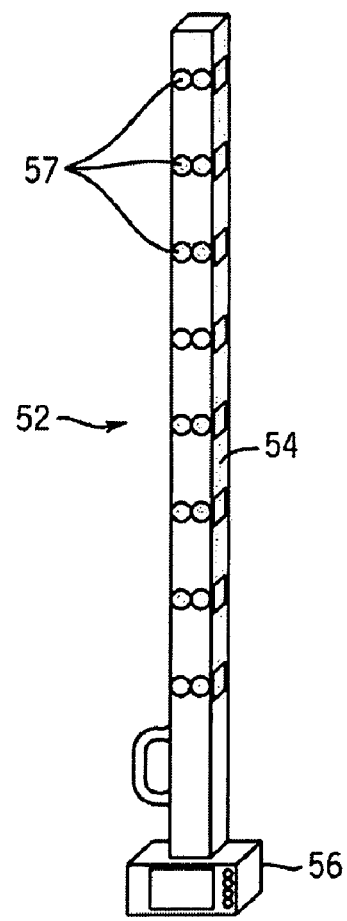
FIG. 12 is a perspective view of a pole device according to a second embodiment of the invention.
Figure 13:
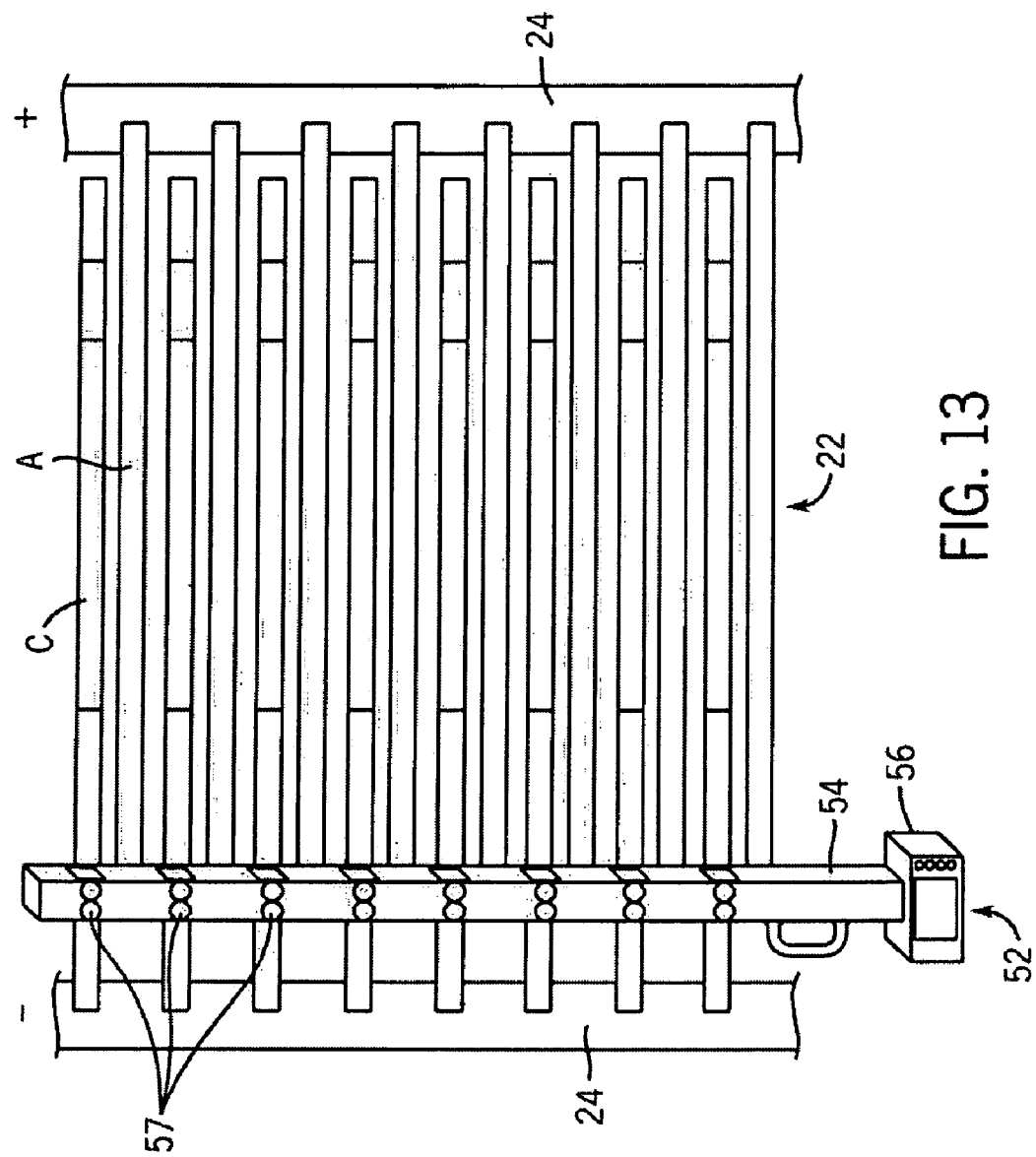
FIG. 13 is a partial perspective view of the pole device of FIG. 12 in operation over the electrolytic cell of FIG. 2.
Figure 14:
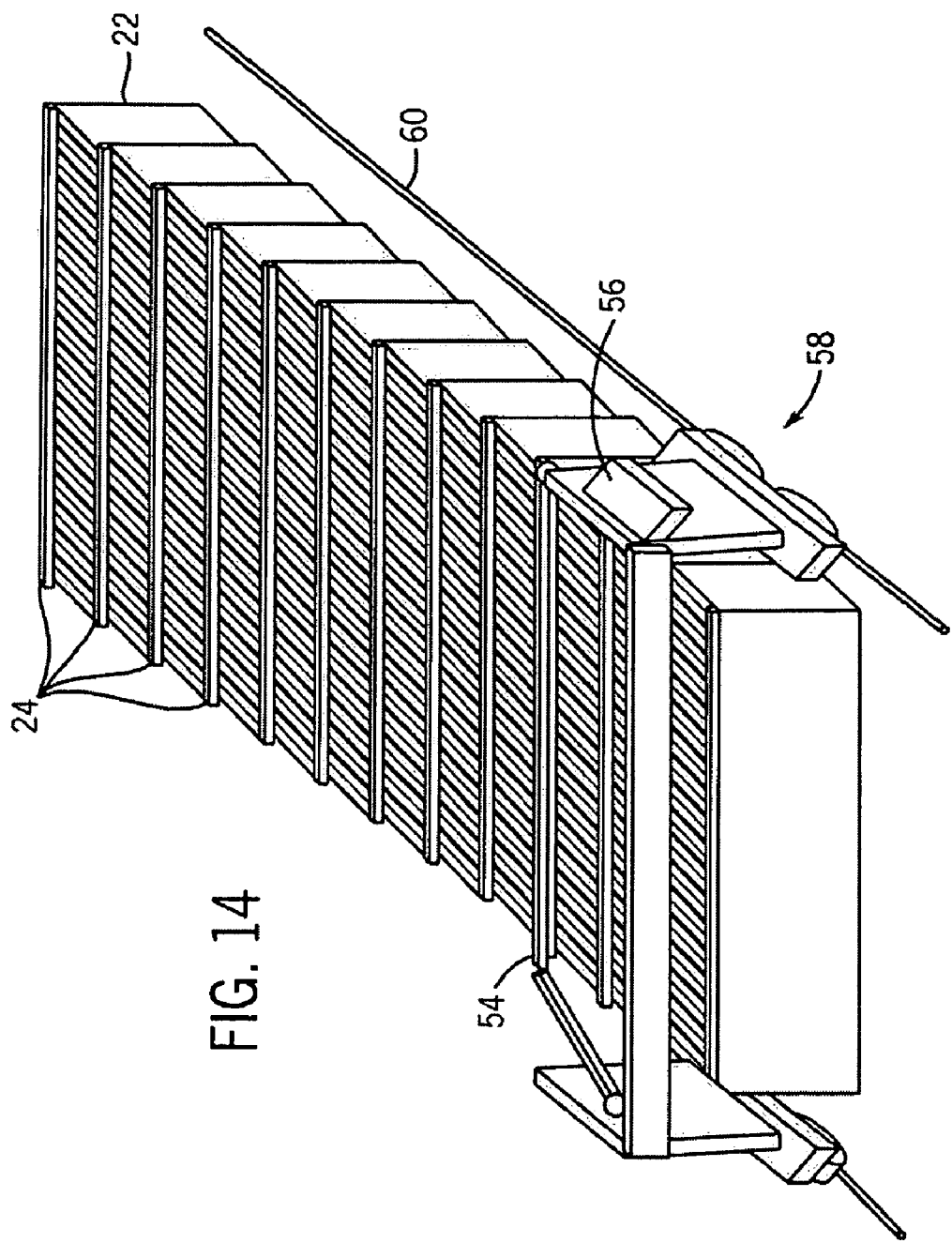
FIG. 14 is a perspective view of a rail car device according to a third embodiment of the invention.

In like fashion, FIGS. 12-14 depict alternative embodiments of the invention, in which autonomous (e.g., un-manned) devices incorporate one of the more inventive features of the present invention.

More specifically, FIGS. 12-13 depict a pole device 52 according to a second embodiment of the invention, in which a Hall Effect sensor array 54 incorporates one or more Hall Effect sensors 28, preferably one Hall Effect sensor 28 for each cathode C of each electrolytic cell 22, thereby enabling simultaneous measurement of multiple cathodes C, including, for example, all of the cathodes C of the electrolytic cell 22.

In such an embodiment, the Hall Effect sensor array 54 may be connected to a processing head 56 for processing data therefrom, the processing head 56 containing one or more of the keyboard 34, LCD display 36 or the like, transceiver 38, or the processor 40 (not shown).

In addition, the Hall Effect sensor array 54 may also include one or more LEDs 58 associated with the Hall Effect sensor 28 for visually indicating the status of the electrolytic cell 22 being monitored. For example, a first (e.g. red) LED could indicate the presence of a short circuit while a second (e.g., green) LED could indicate the presence of an open circuit. Audio indicators and alarms can likewise be provided, as can automated marking mechanisms (e.g., chalk, tape, inkjet, or the like) for automatically identifying problem cathodes C according to pre-defined thresholds. In such embodiments, open and short clearing crews can respond to the visible or audible alarm communicators of electrolytic cell 22 data, as can automated arrangements for responding to the same. In such embodiments, the outputs are provided to communicate electrolytic cell 22 data. These types of indicators permit operators to focus efforts away from a large population of electrolytic cells 22 and focus on such electrolytic cells 22 that need more immediate attention.

Likewise, FIG. 14 depicts a rail car device 58 according to a third embodiment of the invention, in which the Hall Effect sensor array 54 incorporates one or more Hall Effect sensors 28, preferably one Hall Effect sensor 28 for each cathode C of each electrolytic cell 22, thereby enabling simultaneous measurement of multiple cathodes C, the Hall Effect sensor array 54 carried by the rail car device 58 along a pair of rails 60 or the like and connected to the processing head 56 for processing data therefrom.

According to a fourth embodiment of the invention (not shown), an overhead crane, robotic, or other device can also carry out the inventive arrangements, in which the Hall Effect sensor array 54 incorporates one or more Hall Effect sensors 28, preferably one Hall Effect sensor 28 for each cathode C of each electrolytic cell 22, thereby enabling simultaneous measurement of multiple cathodes C, the Hall Effect sensor array 54 carried by the overhead crane, robotic, or other device and likely connected to a processing head 56 for processing data therefrom.

As described, those skilled in the art will recognize that many of the inventive arrangements can be realized in hardware, software, firmware, or any various combinations thereof. Moreover, any kind of processor 40, or other apparatus, adapted for carrying out the inventive arrangements described herein is suited. A typical combination of hardware and software, for example, could be a general purpose microprocessor chips (e.g., MPU) with a computer program that, upon loading and execution, controls the processor 40 such that the described inventive arrangements are realized. Accordingly, the processor 40 may be an integrated component with the Hall Effect sensor 28 or physically remote therefrom.

Furthermore it should be readily apparent that this specification describes exemplary, representative, and non-limiting embodiments of the inventive arrangements. Accordingly, the scope of this invention is not limited to any of these embodiments. Rather, the details and features of these embodiments were disclosed as required. Thus, many changes and modifications—as apparent to those skilled in the art—are within the scope of the invention without departing from the scope hereof, and the inventive arrangements are necessarily inclusive thereof. Accordingly, to apprise the public of the spirit and scope of this invention, the following claims are made:

What is claimed is:

1. An apparatus, comprising:
   one or more sensors adapted to measure magnetic field strength generated about a conductor, said conductor adapted to carry electrical current to or from an electrolytic cell;
   a proximity sensor in electrical communication with one or more of said sensors for activating said sensors when said one or more sensors are in close physical proximity to one or more of said conductors; and
   a processor in electrical communication with one or more of said sensors for determining a compensated magnetic field strength generated about said conductor by compensating said magnetic field strength for other magnetic fields generated by other conductors adapted to carry electrical current to or from said electrolytic cell.

2. The apparatus of claim 1, wherein said processor uses said compensated magnetic field strength to determine cathode electrical current carried by said conductor.

3. The apparatus of claim 2, further comprising:
   means for identifying a short circuit between an anode and cathode of said electrolytic cell based on said cathode electrical current.

4. The apparatus of claim 2, further comprising:
   means for identifying an open circuit at an anode or cathode of said electrolytic cell based on said cathode electrical current.

5. The apparatus of claim 2, further comprising:
   means for identifying a short circuit between an anode and cathode of said electrolytic cell if said cathode electrical current is above a specified value.

6. The apparatus of claim 2, further comprising:
   means for identifying an open circuit at an anode or cathode of said electrolytic cell if said cathode electrical current is below a specified value.

7. The apparatus of claim 1, wherein one or more of said sensors are Hall Effect sensors detached from the conductor.

8. The apparatus of claim 1, wherein said apparatus includes one or more sensors for each cathode of said electrolytic cell.

9. The apparatus of claim 1, further comprising:
   means for communicating said compensated magnetic field strength to a central control unit.

10. The apparatus of claim 1, wherein said apparatus is selected from a group consisting of a hand-held pole, a rail car, a robot, and a crane.

11. A method, comprising:
    providing one or more sensors, said sensors adapted to measure magnetic field strength generated about a conductor, said conductor adapted to carry electrical current to or from an electrolytic cell;
    detecting, with a proximity sensor, when the one or more sensors are proximate to the conductor; and
    determining a compensated magnetic field strength generated about said conductor by compensating said magnetic field strength for other magnetic fields generated by other conductors adapted to carry electrical current to or from said electrolytic cell.

12. The method of claim 11, further comprising:
    determining cathode electrical current carried by said conductor based on said compensated magnetic field strength.

13. The method of claim 11, further comprising:
    identifying a short circuit between an anode and cathode of said electrolytic cell based on said cathode electrical current.

14. The method of claim 11, further comprising:
    identifying an open circuit at an anode or cathode of said electrolytic cell based on said cathode electrical current.

15. The method of claim 11, further comprising:
    identifying a short circuit between an anode and cathode of said electrolytic cell if said cathode electrical current is above a specified value.

16. The method of claim 11, further comprising:
    identifying an open circuit at an anode or cathode of said electrolytic cell if said cathode electrical current is below a specified value.

17. The method of claim 11, wherein one or more of said sensors are Hall effect sensors, the method comprising activating, with the proximity sensor, the Hall effect sensors.

18. The method of claim 11, further comprising: providing a sensor for each cathode of said electrolytic cell.

19. The method of claim 11, further comprising:
    communicating said compensated magnetic field strength to a central control unit.

20. The method of claim 11, further comprising:
    providing one or more of said sensors via an apparatus selected from a group consisting of a hand-held pole, a rail car, a robot, and a crane.

21. The method of claim 11 wherein the electrolytic cell comprises a plurality of spaced-apart conductors, the method comprising moving the sensors across the conductors.

* * * * *

UNITED STATES PATENT AND TRADEMARK OFFICE
CERTIFICATE OF CORRECTION

PATENT NO.         : 7,445,696 B2
APPLICATION NO.    : 11/082545
DATED              : November 4, 2008
INVENTOR(S)        : Eugene Yanjun You et al.

It is certified that error appears in the above-identified patent and that said Letters Patent is hereby corrected as shown below:

Column 7, line 34: Replace "$C_m^{++} + 2e^- = Cu^0$" with --$Cu^{++} + 2e^- = Cu^0$--.

Signed and Sealed this

Thirtieth Day of December, 2008

JON W. DUDAS
*Director of the United States Patent and Trademark Office*